United States Patent [19]
Akanuma et al.

[11] Patent Number: 5,836,325
[45] Date of Patent: Nov. 17, 1998

[54] RUNNING WATER TYPE WASHING MACHINE

[75] Inventors: Shigeo Akanuma; Masashi Fujii, both of Ayase, Japan

[73] Assignee: Speedfam Clean System Co., Ltd., Ayase, Japan

[21] Appl. No.: 714,382

[22] Filed: Sep. 16, 1996

[30] Foreign Application Priority Data

Feb. 20, 1996 [JP] Japan .................................. 8-056977

[51] Int. Cl.$^6$ ....................................................... B08B 3/04
[52] U.S. Cl. ............................................ 134/183; 134/902
[58] Field of Search ................................... 134/182, 183, 134/186, 902, 154

[56] References Cited

U.S. PATENT DOCUMENTS 2,713,347  7/1955  Hazy .................................. 134/186 X

FOREIGN PATENT DOCUMENTS 61-130389  8/1986  Japan .
64-63086   3/1989  Japan .

OTHER PUBLICATIONS

IBM Technical Disclosure Bulletin "Multistage Rinse Tank", vo. 11, No. 11, Apr. 1969.

*Primary Examiner*—Philip R. Coe
*Attorney, Agent, or Firm*—Oblon, Spivak, McClelland, Maier & Neustadt, P.C.

[57] ABSTRACT

In order to adjust flow conditions of a wash liquid without necessitating replacement of a flow regulator plate, a flow regulator means 8 located downstream of a washing section of a running water type washing machine is constituted by a couple of perforated regulator plates 18 and 19 which are located across the flow passage of the wash liquid in a overlapped state and shiftable relative to the other in the vertical direction for adjustments of the open area defined by the respective water passage apertures.

5 Claims, 4 Drawing Sheets

RUNNING WATER TYPE WASHING MACHINE

BACKGROUND OF THE INVENTION

1. Field of the Art

This invention relates to a running water type washing machine suitable for precision wash of work which requires a high degree of cleanliness like semiconductor wafers, magnetic disk substrates or other electronic parts, optical parts, precision mechanical parts etc.

2. Prior Art

Various running water type washing machines, which are designed to wash work in a submerged state under uniform streams of a wash liquid, have thus far been known in the art, for example, from Laid-Open Japanese Utility Model Specification S61-130389 and also from Laid-Open Japanese Patent Specification S64-63086.

In a washing machine of this sort, for the purpose of preventing detached contaminant substances from being entrained on turbulent wash liquid flows and brought back to re-deposit on work, it has been the general practice to provide a porous flow regulator plate across a channel-like flow passage of a wash liquid, passing the wash liquid therethrough to regulate samba into turbulence-free uniform streams (laminar streams).

The wash liquid is put in a flow at an extremely low velocity, for instance, at a velocity of about 2 mm–20 mm/sec, which is determined depending upon the balance between a liquid feed rate and a liquid discharge rate. On the other hand, the optimum flow velocity is determined in consideration of the nature of work to be washed, the type of wash liquid and the required accuracy of washing.

Besides, it has been known that, on an upstream side of a washing vessel, the flow conditions of a wash liquid are susceptible to influences of a flow regulator plate which is located upstream of a washing zone of the washing vessel, and, on a downstream side of the washing vessel, to influences of a flow regulator plate which is located downstream of the washing zone. Therefore, in consideration of the influences on the flow of a regulated wash liquid, the flow regulator plate on the downstream side plays an important role in maintaining regulated uniform laminar streams of the wash liquid. In case the open area of the downstream regulator plate does not conform with a flow velocity or flow rate of a wash liquid, smooth flow of the wash liquid is impeded particularly on the downstream side of a washing vessel to give rise to various problems such as stagnation in certain localities of the flow, differences in flow velocity between upper and lower layers, and disintegration of a laminar flow due to occurrence of convective currents between upper and lower layers of the wash liquid flow.

Therefore, in such a case, it becomes necessary to adjust the wash liquid flow in such a way as to equalize the flow in upper and lower layers by replacing the downstream flow regulator plate for a different open area. However, the job of selecting and replacing the regulator plate for an aimed flow velocity or other operating conditions is extremely troublesome and can be a great burden on the part of the operator. Besides, the need for providing a large number of regulator plates of different open areas entails additional cost and labor for handling and administering a stock of regulator plates in storage.

SUMMARY OF THE INVENTION

It is a primary object of the present invention to provide a running water type washing machine which is capable of adjusting flow conditions of a wash liquid without necessitating replacements of a flow regulator plate on the downstream side of a flow passage of the wash liquid.

It is another object of the present invention to provide a running water type washing machine employing a flow regulator with a variable open area on the downstream side of a flow passage of a wash liquid, permitting to adjust flow conditions of the wash liquid without necessitating replacements of a regulator plate.

It is still another object of the present invention to provide a running water type washing machine employing, on the downstream side of a flow passage of a wash liquid, a flow regulator with an overall open area which can be adjusted easily by simple means in an assured manner.

It is a further object of the present invention to provide a running water type washing machine which can adjust flow conditions in upper and lower layers of a wash liquid in a simple and reliable manner.

In accordance with the present invention, for achieving the above-stated objectives, there is provided a flow regulator means for use on the downstream side of a flow passage of a running water type washing machine, the downstream flow regulator means employing a perforated or porous flow regulator plate or plates each containing a plural number of water passage apertures with an adjustable open area for passage of a wash liquid.

With the running water type washing machine of the arrangements just described, the regulator plate or plates of the downstream flow regulator means are shiftable in position for adjustments of an open area, so that one can easily and arbitrarily adjust the open area of the flow regulator on the downstream side of the flow passage in an extremely facilitated manner whenever there arises a necessity for adjustment of flow velocity or other flow conditions on the downstream side, without replacing the flow regulator means itself.

In one specific form of the present invention, the downstream flow regulator means is constituted by a couple of perforated regulator plates containing water passage apertures of identical constructions and mounted in position in a relatively displaceably overlapped state, permitting to adjust overlapped conditions of the water passage apertures in the two regulator plates easily in the flow direction of the wash liquid.

Accordingly, the open area of the downstream flow regulator means, which is determined by the respective water passage apertures in the two regulator plates, can be varied readily in an extremely facilitated manner simply by shifting one regulator plate relative to the other.

According to another specific form of the present invention, the first and second perforated regulator plates of the downstream flow regulator means are located at such a height that part of the wash liquid is allowed to flow over the top of the regulator plates, and the first perforated regulator plate is provided with a plural number of notches substantially of V-shape along the upper edge thereof for passage of the wash liquid therethrough.

This arrangement of overflowing part of the wash liquid contributes to maintain a laminar flow by accelerating the flow in the vicinity of the liquid surface where the wash liquid would tend to stagnate unless allowed to overflow, while stabilizing overflow conditions by way of the V-notches at the upper edge of the first regulator plate.

According to still another specific form of the present invention, the downstream flow regulator means is constituted by a regulator plate containing a plural number of water passage apertures which can be partly blocked by means of plug means for adjustments of water passage open area through the regulator means.

Further, according to the invention, preferably the regulator plate of the downstream flow regulator means is provided with a water passage gap at its lower end substantially across the entire width of the flow passage of the wash liquid. This water passage gap at the lower end of the regulator plate contributes to equalize flow velocities of upper and lower layers by accelerating the flow velocity of the lowermost layer which would otherwise tend to lag behind upper layers.

The above and other objects, features and advantages of the invention will become apparent from the following description and the appended claims, taken in conjunction with the accompanying drawings which show by way of example preferred embodiments of the invention.

DESCRIPTION OF PREFERRED EMBODIMENTS

Hereafter, the present invention is described more particularly by way of its preferred embodiments with reference to the accompanying drawings.

Figure 1:
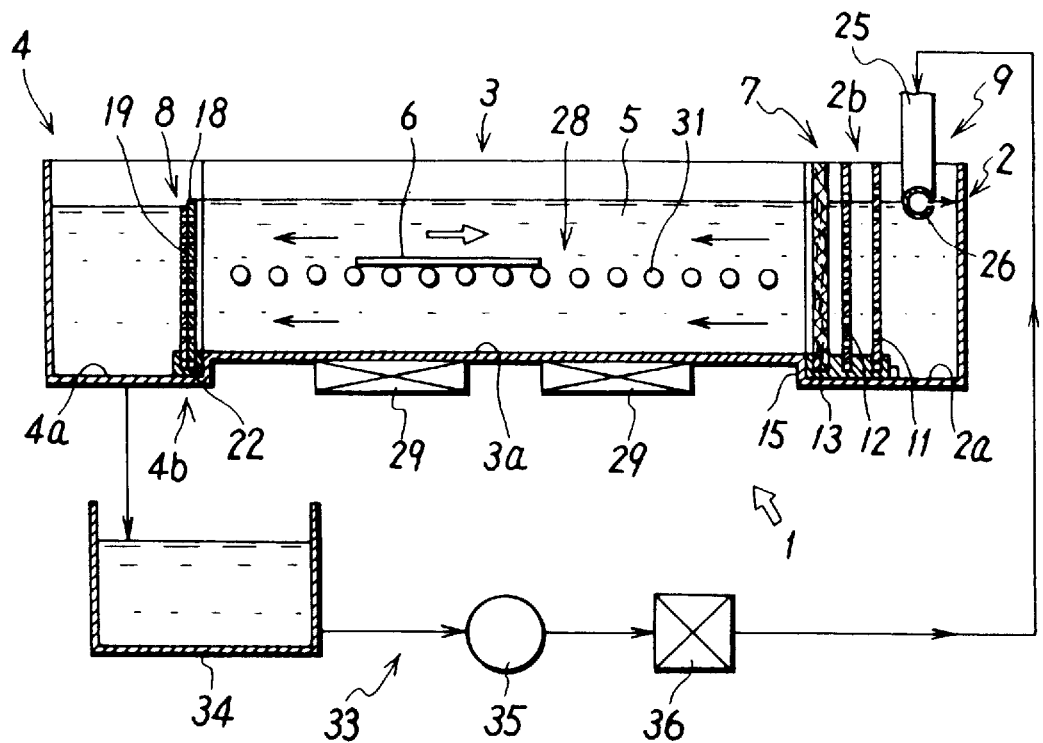
FIG. 1 is a schematic vertical section of a running water type washing machine embodying the present invention.
Figure 2:
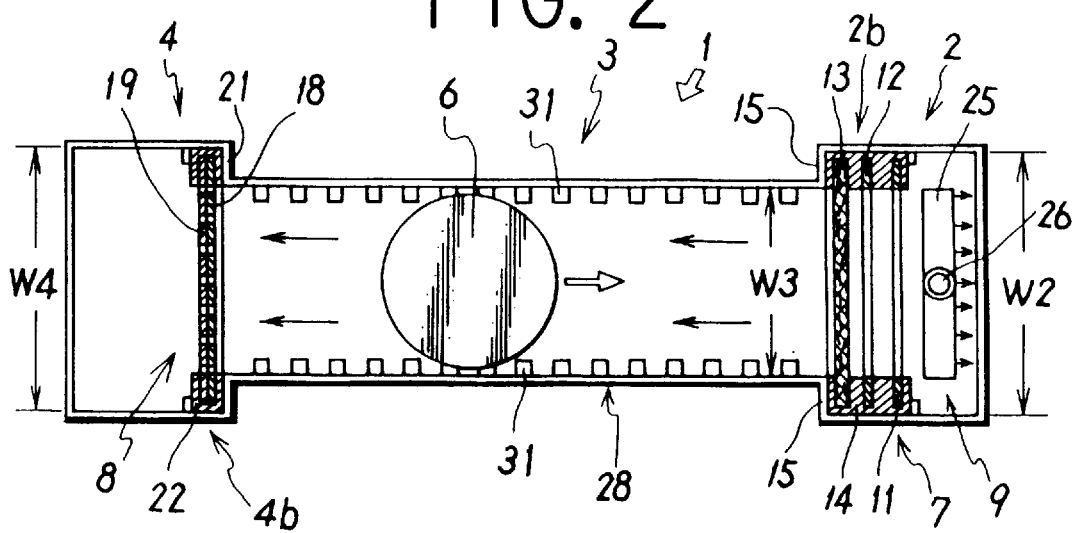
FIG. 2 is a partly sectioned plan view of the washing machine of FIG. 1.

Referring to FIGS. 1 and 2, there is shown an embodiment of the running water type washing machine embodying the present invention, the washing machine having a washing vessel 1 of the so-called lateral flow type which is arranged to wash work 6 in a wash liquid flowing in a lateral direction through and along a water passage in the washing vessel at a moderate or low velocity (e.g., at about 5 mm to 20 mm/sec).

The washing vessel 1 includes a liquid feed section 2 which supplies a wash liquid 5 such as pure or ultra-pure water, chemical treatment liquid or the like, a liquid discharge section 4 which discharges spent wash liquid to the outside, and a washing section 3 which is provided between the liquid feed section 2 and the liquid discharge section 4 and in which a work 6 is washed in a submerged state under streams of the wash liquid 5 flowing from the liquid feed section 2 to the liquid discharge section 4.

The above-mentioned liquid feed section 2 and the liquid discharge section 4 of the washing vessel 1 are formed in broader widths W2 and W4, respectively, as compared with the intermediate washing section 3 with a width W3. In addition, the liquid feed section 2 and the liquid discharge section 4 are formed deeper than the intermediate washing section 3, with bottom levels 2a and 4a which are sunken or stepped down from a bottom level 2a of the intermediate washing section 3 of predetermined width and depth.

Provided in part of the liquid feed and discharge sections 2 and 4 are flow regulation means mount portions 2b and 4b, respectively, for installation of flow regulator means 7 and 8 which regulate the wash liquid into uniform laminar streams.

A liquid feeder means 9 is provided in the liquid feed section of the vessel 1 at a position upstream of the above-mentioned flow regulation means 7 for supply of the wash liquid 5.

The upstream flow regulator means 7 on the side of the liquid feed section 2 is composed of three porous flow regulator plates 11 to 13. Of these regulator plates, a first regulator plate 11, which is located in the most upstream side, and a second regulator plate 12, which is located immediately on the downstream side of the first regulator plate 11, are each in the form of a metallic or ceramic perforated plate with a multitude of water passage apertures 11a or 12a, while the third regulator plate 13, which is located on the most downstream side, is in the form of a fibrous plate, for example, of relative coarse non-woven fabric having a pleated or other suitable structure and consisting of nylon, polyester or other synthetic fiber.

At the above-described flow regulator means 7, the wash liquid 5, which is still in a turbulent state when coming out of the liquid feeder means 9, is successively passed through the first and second flow regulator plates 11 and 12 in the first place thereby to absorb turbulences in the wash liquid while at the same time imparting thereto a certain degree of directionability to form an almost uniform flow which is equalized in flow velocity of upper and lower layers. Then, the wash liquid is passed through the third regulator plate 13 of fibrous material which further restricts diffusive movements of the wash liquid to send it to the washing section 3 in uniform laminar streams.

Preferably, the flow regulator means 7 is provided in the form of a flow regulation module unit which retains the respective regulator plates 11 to 13 replaceably in predetermined spaced positions on a holder frame 14 of a closed rectangular shape or of an open-topped U-shape. The flow regulation unit is removably installed in the above-mentioned regulator mount portion 2b of the liquid feed section 2, with the holder frame 14 in abutting engagement with the stepped portion 15 at the border between the liquid feed section 2 and the washing section 3 in such a way that only perforated portions of the respective regulator plates 11 to 13 are disposed in the flow passage to the ensuing washing section 3.

Consequently, the wash liquid 5 can be regulated into a uniform flow in an assured manner without being disturbed by the holder frame 14 which is located behind the stepped portion bordering on the wash section 3.

However, it is to be understood that the above-described upstream flow regulator means 7 is not restricted to the particular example shown, and may be constituted by a single or a plural number of perforated regulator plates alone or by a single or a plural number of fibrous regulator plates alone if desired.

On the other hand, the downstream flow regulator means 8 on the side of the liquid discharge section 4 is constituted by a couple of perforated metal or ceramic plates 18 and 19 each containing a multitude of water passage apertures.

Figure 3:
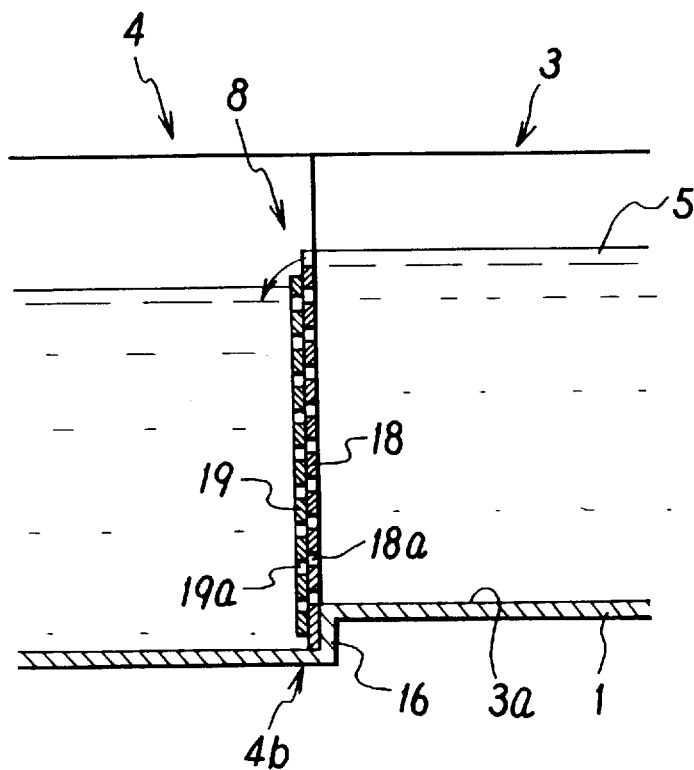
FIG. 3 is an enlarged fragmentary view of machine components shown in FIG. 1.
Figure 5:
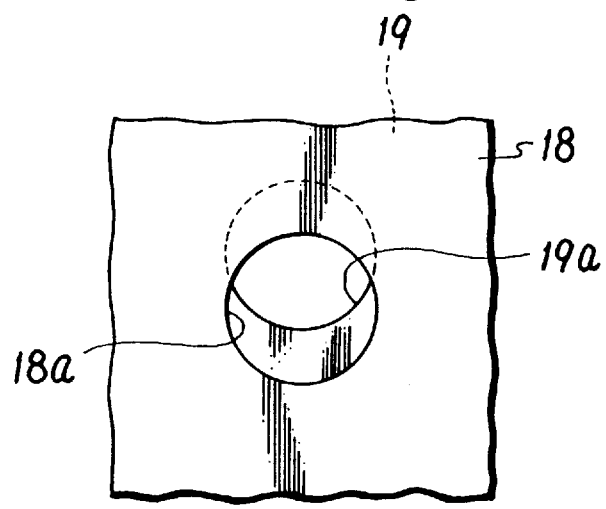
FIG. 5 is an enlarged fragmentary view of water passage apertures.
Figure 6:
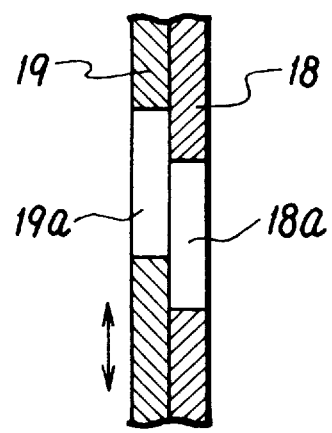
FIG. 6 is a fragmentary vertical section of the water passage apertures of FIG. 5.

The two regulator plates 18 and 19 of the downstream flow regulator means 8 are provided with water passage apertures 18a and 19a, respectively, which are of the same construction. More specifically, in this particular embodiment, the water passage apertures 18a and 19a in the regulator plates 18 and 19 are identical with each other in size, number and arrangement. As seen in FIG. 3, the first regulator plate 18 on the upstream side is fixedly mounted in the afore-mentioned regulator mount portion 4b behind a stepped portion 16 bordering on the washing section 3, while the second regulator plate 19 on the downstream side is located either on the upstream or downstream side (preferably on the downstream side) of the first regulator plate 18 in an overlapped state and vertically adjustably through a suitable mount mechanism. As shown particularly in FIGS. 5 and 6, overlapping conditions of the water passage apertures 18a and 19a in the two regulator plates 18 and 19 can be adjusted by vertically shifting the position of the second regulator plate 19, for adjusting the open areas defined by the respective water passage apertures.

Figure 4:
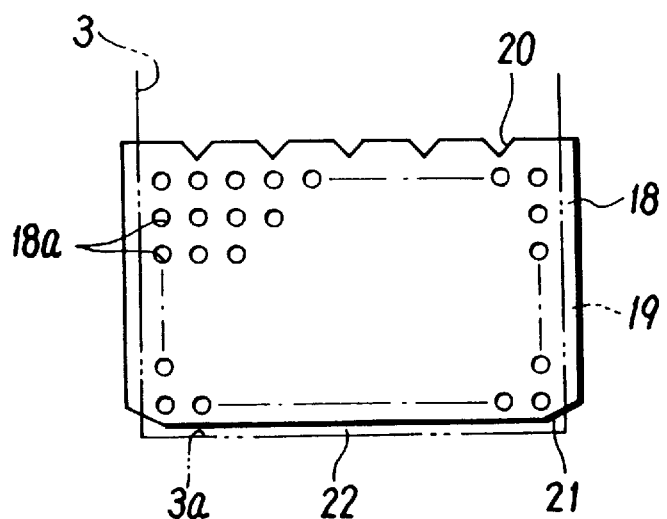
FIG. 4 is an enlarged fragmentary view of a machine component shown in FIG. 3.

The first regulator plate 18 is located at such a level where part of the wash liquid is allowed to flow over its top, but the second regulator plate 19 is located at a slightly lower level. As seen in FIG. 4, the first regulator plate 18 is provided with a plural number of water passage notches substantially of V-shape at predetermined intervals along its upper edge for stabilizing the overflow conditions of the wash liquid.

As shown in FIGS. 1 and 2, the first and second regulator plates 18 and 19 may be removably mounted in the regulator mount portion 4b of the liquid discharge section 4 by way of a holder frame 22 which retains the two regulator plates in an adjustably overlapped state so that one can adjust the open area simply by shifting the positions of the overlapped water passage apertures 18a and 19a relative to each other as explained above. Alternatively, as shown in FIG. 3, the second regulator plate 19 may be vertically adjustably mounted on the first regulator plate 18 which is directly fixed to the stepped portion 16.

At the above-described downstream flow regulator means 8, the wash liquid 5 from the washing section 3 flows into the discharge section 4 mostly through the water passage apertures 18a and 19a in the regulator plates 18 and 19, while part of the wash liquid is allowed to flow into the discharge section 4 over the regulator plates 18 and 19, thereby to maintain a uniform flow of the wash liquid.

In this regard, when there arises a necessity for changing the open area determined by the two regulator plates 18 and 19, for adjustment of flow conditions in upper and lower layers of the wash liquid 5 according to its flow velocity, the position of the second regulator plate 19 is shifted upward or downward to a suitable degree relative to the other regulator plate 18. By so doing, the open area of the flow regulator is increased or reduced according to the overlapping conditions of the water passage apertures 18a and 19a of the two regulator plates 18 and 19.

Therefore, on such occasions, the operator is not required to replace the regulator plate of the downstream flow regulator means, and can cope with necessary adjustments in an extremely facilitated and efficient manner.

More specifically, with a larger open area of the regulator plates 18 and 19, the wash liquid is passed through the water passage apertures 18a and 19a at a greater flow rate. As a result, the overflow rate is reduced due to a drop of the surface level of the wash liquid, and the flow velocity of upper layers become smaller. On the contrary, with a smaller open area, the wash liquid is passed through the water passage apertures 18a and 19a at a smaller flow rate, elevating the surface level of the wash liquid to increase the overflow rate and the flow velocity of upper layers.

Preferably, the dimensions and shapes of the water passage apertures 18a and 19a of the two regulator plates 18 and 19 are arranged in such a way that they are a half-open or half-closed state when the two regulator plates 18 and 19 are in a normal position relative to the other. When arranged in that way, one can adjust flow conditions of the wash liquid 5 simply by shifting the position of the regulator plate 18 or 19 in the upward or downward direction relative to the other plate to increase or reduce the open area of the flow regulator.

The water passage apertures 18a and 19a of the two flow regulator plates 18 and 19 may be formed in any other arbitrary shapes, for example, may be in circular, elliptic, square, rectangular or narrow slit-like shape or in any other shapes.

Further, the water passage apertures of the same size may be distributed over the entire areas of the flow regulator plates 18 and 19 uniformly or in a varying density or pitch. Alternatively, the size of water passage apertures, which are formed regularly at predetermined intervals or in a predetermined pitch, may be varied from in certain areas of the regulator plates. For instance, the size of the water passage apertures may be increased or minimized toward the upper ends of the regulator plates depending upon the intended regulative effects.

In this regard, in the case of regulator plates with uniformly distributed water passage apertures, the flow of the wash liquid is fastest in a region slightly upward of a middle point in depth and gradually becomes slower away from that region. Therefore, regulator plates, in which the size or density of the water passage apertures are gradually increased toward the bottom end to provide a downwardly increasing open area, can be effectively used as means for maintaining a uniform flow by accelerating the flow velocity of the lowermost layer which would otherwise tend to lag behind upper layers.

As for other effective means, a water passage gap space may be provided along the lower ends of the regulator plates 18 and 19 substantially across the entire width of the flow passage. The gap space of this sort may be in the form of a slit extending transversely along the lower end of each regulator plate, or may be a clearance 22 which is opened between the bottom surface 3a of the washing section 3 and the lower ends of the regulator plates 18 and 19 as shown in FIG. 4. Alternatively, a gap space or spaces of this sort may be in the form of notches 21 which are formed by cutting off lower corner portions of each regulator plate along a straight or outwardly convex arcuate line.

The provision of gap space or spaces at the lower ends of the regulator plates contributes not only to put the lowermost layer of the wash liquid in a smooth flow but also to discharge therethrough contaminant substances of relative large specific gravity in an assured manner along with the wash liquid upon detachment from the work 6.

It is preferable that the above-described water passage gap space or spaces have a variable open area.

The liquid feeder means 9 in the liquid feed section of the washing vessel 1 includes a horizontal spout pipe 26 at the lower end of a conduit 25 which is connected to a wash liquid source, not shown. The spout pipe 26 is provided with a plural number of spout holes 26a along its lateral side and so positioned as to spout the wash liquid 5 at a level substantially same as the surface level of the wash liquid 5 in the liquid feed section 2.

However, it is to be understood that the arrangement of the liquid feeder means 9 is not restricted to the particular example shown.

Further, preferably the washing section 3 of the washing vessel 1 is provided with a transfer means 28 to transfer work 6 from its downstream end to upstream end in the counter-flow direction and in a submerged state under streams of the wash liquid 5, and at least one ultrasonic radiation means 29 to enhance the washing effects by application of ultrasound energy.

As shown in the drawing, the transfer means 28 can be constituted by a roller conveyer consisting of a plural number of rollers which are rotatably supported at predetermined intervals on and along the opposite side walls of the washing section 3 and adapted to be driven from an electric motor, not shown, to transfer the work 6 in a horizontally supported state in the counter-flow direction. However, the transfer means 28 is not restricted to the particular example shown, and may be arranged to transfer the work 6 in a vertical position on a support moving parallel with the streams of the wash liquid 5.

For the purpose of recycling used wash liquid, it is desirable to provide a recycling circuit 33 between the liquid feed section 2 and the liquid discharge section 4, including a reservoir tank 34 for collecting effluent wash liquid 5 from the discharge section 4, a pump 35 for sending the wash liquid 5 back to the liquid feed section 2, and a filter 36 for cleaning the recycling wash liquid 5.

In the washing machine of the above-described arrangements, the wash liquid 5, which is fed to the liquid feed section 2 through the spout pipe 26 of the liquid feeder means 26, is regulated into uniform streams as it is successively passed through the first to third regulator plates 11 to 13 of the upstream flow regulator means 7 on its way to the washing section 3. On the other hand, at the downstream flow regulator means 8, the wash liquid is passed through the regulator plates 18 and 19 and discharged to the outside along with part of the wash liquid 5 flowing into the discharge section 4 over these regulator plates. In case the washing machine includes above-described recycling circuit 33, the effluent wash liquid 5 is cleaned by filtration prior to recirculation to the liquid feed section 2.

In operation, the work 6 to be washed is put on the roller conveyer 31 at the downstream end of the washing section 3 by a loading means, not shown, and transferred toward the upstream end in the counter-flow direction while undergoing washing actions by the wash liquid 5. The washed work is picked up out of the washing vessel 1 at the upstream end of the washing section by an unloading means which is also not shown.

Contaminant substances detached from the work 6 are carried away from the latter, entrained on the streams of the wash liquid 5, and discharged from the liquid discharge section 4 without being allowed to re-deposit on the work 6.

Figure 7:
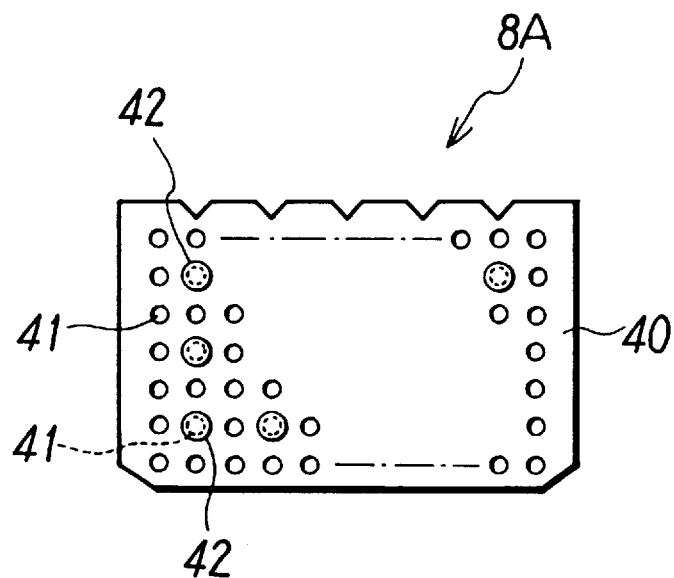
FIG. 7 is a back view of a downstream flow regulator means employed in a second embodiment of the invention.

Shown in FIG. 7 is another embodiment of the downstream flow regulator means, that is, a flow regulator means 8A which is provided with a single flow regulator plate 40 corresponding to the first regulator plate 18 in the above-described first embodiment. The regulator plate 40 is perforated with a plural number of water passage apertures 41 some of which can be closed with plug member 42 for adjustment of the open area of the regulator plate.

Figure 8:
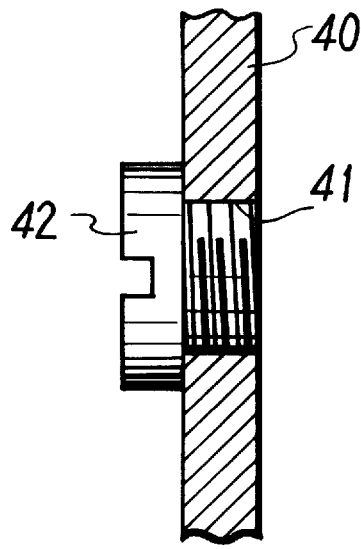
FIG. 8 is an enlarged vertical section of a water passage aperture blocked by a closure plug.
Figure 9:
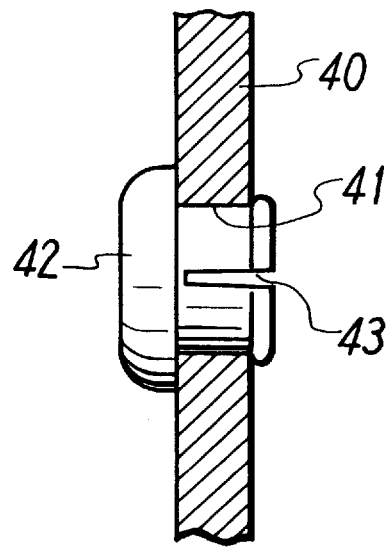
FIG. 9 is an enlarged vertical section of a water passage aperture blocked by a closure plug of a different type.

In this instance, as shown in FIG. 8, the water passage apertures 41 may be in the form of tapped holes into which male plug members 42 can be threaded from the front or rear side, or in the form of ordinary through holes in which plug members 42 of synthetic resin or metal material can be retained resiliently by press-fit. In the case of ordinary through holes, it is desirable to provide slits 43 in the plug members 42 to impart resiliency thereto.

As described above, the running water type washing machine according to the present invention employs, on the downstream side of the washing section, a flow regulator plate having a variable open area to permit adjustments of flow conditions in upper and lower layers easily in a secure manner simply by adjusting the open area of the regulator plate without necessitating its replacement.

Accordingly, the present invention permits to adjust the flow conditions of the wash liquid in an extremely facilitated manner, obviating the necessity for keeping a large number of regulator plates of different open areas and thus contributing to lessen the cost and labor which would incur in storage, administration and handling of such extra regulator plates.

What is claimed is:

1. A running water type washing machine with a washing vessel defining a flow passage of a wash liquid from a liquid feed section to a liquid discharge section via an intermediate washing section for washing work in submerged state under streams of said wash liquid from said liquid feed section, and upstream and downstream flow regulation means located across the flow passage in said liquid feed and liquid discharge sections, respectively, for regulating the flow of said wash liquid, characterized in that:

said downstream flow regulation means is constituted by a pair of first and second regulator plates containing plural water passage apertures of identical constructions with an adjustable open area, said regulator plates being located across said flow passage in an overlapped state and adjustably relative to the other in the vertical direction.

2. A running water type washing machine as defined in claim 1, wherein said paired regulator plates are located at such a height as to permit part of said wash liquid to overflow through the top thereof, and said first regulator plate is projected above a top end of said second regulator plate and provided with water passage notches substantially of V-shape along a projected upper edge thereof.

3. A running water type washing machine as defined in claim 1 or 2, wherein one of said regulator plates of said downstream flow regulation means is provided with a water passage gap in a lower end portion substantially over the entire width of said flow passage of said wash liquid.

4. A running water type washing machine with a washing vessel defining a flow passage of a wash liquid from a liquid feed section to a liquid discharge section via an intermediate washing section for washing work in submerged state under streams of said wash liquid from said liquid feed section, and upstream and downstream flow regulation means located across the flow passage in said liquid feed and liquid discharge sections, respectively, for regulating the flow of said wash liquid, characterized in that:

said downstream flow regulation means is constituted by a regulator plate containing a plural number of water passage apertures which are adjustable in open area by blocking part of said water passage apertures with plug means.

5. A running water type washing machine as defined in claim 4, wherein said regulator plate of said downstream flow regulator means is provided with a water passage gap in a lower end portion substantially over the entire width of said flow passage of said wash liquid.

* * * * *